United States Patent [19]
Wayner

[11] Patent Number: 6,054,875
[45] Date of Patent: Apr. 25, 2000

[54] OUTPUT BUFFER FOR A MIXED VOLTAGE ENVIRONMENT

[75] Inventor: Zelig Wayner, Haifa, Israel

[73] Assignee: Intel Corporation, Santa Clara, Calif.

[21] Appl. No.: 09/001,764

[22] Filed: Dec. 31, 1997

[51] Int. Cl.[7] .................... H03K 17/16; H03K 19/0175; H03B 1/00
[52] U.S. Cl. ............... 326/83; 326/68; 326/121; 326/80; 326/81; 326/87; 326/31; 326/63; 327/108; 327/109
[58] Field of Search .................. 326/63, 68, 80, 326/81, 83, 87, 86, 121, 31; 327/108, 109

[56] References Cited

U.S. PATENT DOCUMENTS

| | | | |
|---|---|---|---|
| 4,978,870 | 12/1990 | Chen et al. | 326/68 |
| 5,243,236 | 9/1993 | McDaniel | 326/68 |
| 5,659,258 | 8/1997 | Tanabe et al. | 326/68 |
| 5,821,800 | 10/1998 | Le et al. | 327/333 |
| 5,834,948 | 11/1998 | Yoshizaki et al. | 326/81 |
| 5,852,371 | 12/1998 | Merritt et al. | 326/81 |
| 5,900,750 | 5/1999 | Schmitt | 327/108 |

*Primary Examiner*—Michael Tokar
*Assistant Examiner*—V Tan
*Attorney, Agent, or Firm*—Blakely, Sokoloff, Taylor & Zafman LLP

[57] ABSTRACT

An output buffer to serve as an interface between a main logic circuit and a peripheral device is described. The output buffer includes a first transistor adapted to be coupled to a first voltage supply and an output terminal. The first transistor is designed to charge the output terminal to a first state. A pull-down network to charge the output terminal to a second state is also included. The pull-down network is adapted to be coupled between the output terminal and a second voltage supply and is designed for alternate operation with the first transistor. The output buffer also includes a logic circuit to enable the first transistor and the pull-down network. The logic circuit is coupled to an enable terminal of the first transistor, the pull-down network, the first voltage supply, and the second voltage supply.

24 Claims, 7 Drawing Sheets

6,054,875

OUTPUT BUFFER FOR A MIXED VOLTAGE ENVIRONMENT

BACKGROUND OF THE INVENTION

1. Field of the Invention

The invention relates in general to the field of logic circuits, and, more particularly, to logic circuits used in computer systems. Specifically, the invention relates to an input buffer to interface between a central processing unit and other components on a main logic circuit within a mixed voltage environment.

2. Description of the Related Art

With the growing complexity of modern computer systems and the availability of various types of peripheral devices, designers are constantly seeking more efficient methods to improve the circuits that serve as interfaces between these peripheral devices and the main circuit board. External devices attached to a computer system are generally referred to as peripheral devices. The main circuit board in a computer system is often referred to as the motherboard. It normally contains the central processing unit (e.g., a microprocessor) and many of the microcontrollers that control standard peripheral devices, such as the display screen, keyboard, and disk drive.

One skilled in the art will appreciate that if a key on a keyboard is depressed, distinct pieces of information (i.e., data) is generated. In most modern computer systems, data is in the form of bits (i.e., binary digits). Bits are typically represented as voltages. When positive logic is used, a bit value of one (i.e., a logic one) is generally represented as a logically high voltage, while a bit value of zero (i.e., a logic zero) is generally represented as a logically low voltage. A logically high voltage, as defined in this application, is a voltage substantially equal to a supply voltage $V_{cc}$ when used "on chip" (e.g., on the motherboard). A logically low voltage is a voltage level substantially equal to a ground voltage $V_{ss}$.

Data is commonly sent from the microprocessor to peripheral devices on the motherboard. Modern computer systems may contain several peripheral devices and other digital devices connected to each other by a bus. The bus transports data among the microprocessors and other components, and is composed of a number of traces. Traces are wire-like connections that are printed on a circuit board and function as transmission lines.

As previously mentioned, data is generally stored as a voltage, and is designated as being in either a logically high or logically low state based on the power supply used to generate that voltage. For example, a logically high voltage on the motherboard would be associated with the reference voltage $V_{cc}$, while a logically high voltage generated by the power supply for one of the peripheral devices may be related to a reference voltage $V_{ccp}$. Typically, the reference voltage $V_{ccp}$ from a peripheral power supply is larger than the reference voltage $V_{cc}$ from the motherboard power supply. The voltage differences between these two logically high levels often warrant an interface circuit between the motherboard and the peripheral devices in a computer system.

Transistors are often considered the building blocks of computing, allowing them to be used to process and store digital signals. Transistors, have an enable terminal that may be used to turn the transistor "on" (i.e., cause it to conduct electricity), depending upon the voltage applied to this terminal. Associated with the turning "on"/"off" of transistors, there is a voltage at which channels form within the transistor and electrical carriers begin to flow more freely. This voltage is generally referred to as the threshold voltage $V_t$. When voltages above the threshold voltage $V_t$ are applied to the enable terminal of a transistor, it begins to conduct current. Logically low and logically high signals have a range of voltages associated with them. The threshold voltage for a given type of transister (e.g., a PMOS transister) transistor lies within these ranges.

Transistors generally have a maximum voltage difference $V_{MAXd}$ that can be applied between the enable terminal and either one of the other terminals. When this voltage difference is exceeded, the transistor may become damaged or fail to operate properly. Gate stress generally results when a voltage difference beyond the maximum voltage difference $V_{MAXd}$ is applied to the enable terminal of a transistor.

To reduce the likelihood of damaging a microprocessor (i.e., central processing unit), signals that are generated by a microprocessor and are to be sent to a peripheral device are generally first sent to an output buffer. The output buffer generally receives the signal and generates a corresponding signal with a voltage level within an allowed range. The output buffer may also be designed to improve the quality of the signal by removing some of the pulse shape distortion such that the signals may be used more effectively by the peripheral devices.

FIG. 1 illustrates a portion of a conventional predriver circuit 100 for an output buffer that may be used as an interface circuit between a peripheral device and a main circuit board. This stage of the predriver circuit 100 receives data from the processor core on a line 103 and generates a corresponding output signal on a line 105 that may be sent to another portion of the output buffer. One skilled in the art will appreciate that a transistor 110, when enabled, may be used to apply a logically high signal to the line 105. The transistor 110 is connected to a peripheral voltage supply 111, which generates a voltage $V_{ccp}$.

Similarly, a transistor 115, when enabled, may be used to apply a logically low signal to the line 105 using a connection to a ground voltage supply 116. A parallel pair of transistors 120,125 are serially connected together and cross-coupled with the transistors 110,115. When a logically low signal is applied to the line 103, biasing the transistor 115 on, and pulling the line 105 to ground $V_{ss}$. The low voltage on the line 105 biases the transistor 120 on, and applying $V_{ccp}$ to the gate of the transistor 110, which gate stresses the transistor 110.

The present invention is directed to overcoming or at least reducing one or more of the problems set forth above.

SUMMARY OF THE INVENTION

The invention relates to an output buffer to serve as an interface between a main logic circuit and a peripheral device. The output buffer includes a first transistor adapted to be coupled to a first voltage supply and an output terminal. The first transistor is designed to charge the output terminal to a first state. A pull-down network to charge the output terminal to a second state is also included. The pull-down network is adapted to be coupled between the output terminal and a second voltage supply and is designed for alternate operation with the first transistor. The output buffer also includes a logic circuit to enable the first transistor and the pull-down network. The logic circuit is coupled to an enable terminal of the first transistor, the pull-down network, the first voltage supply, and the second voltage supply.

BRIEF DESCRIPTION OF THE DRAWINGS

Other objects and advantages of the invention will become apparent upon reading the following detailed description and upon reference to the drawings in which.

Figure 1:
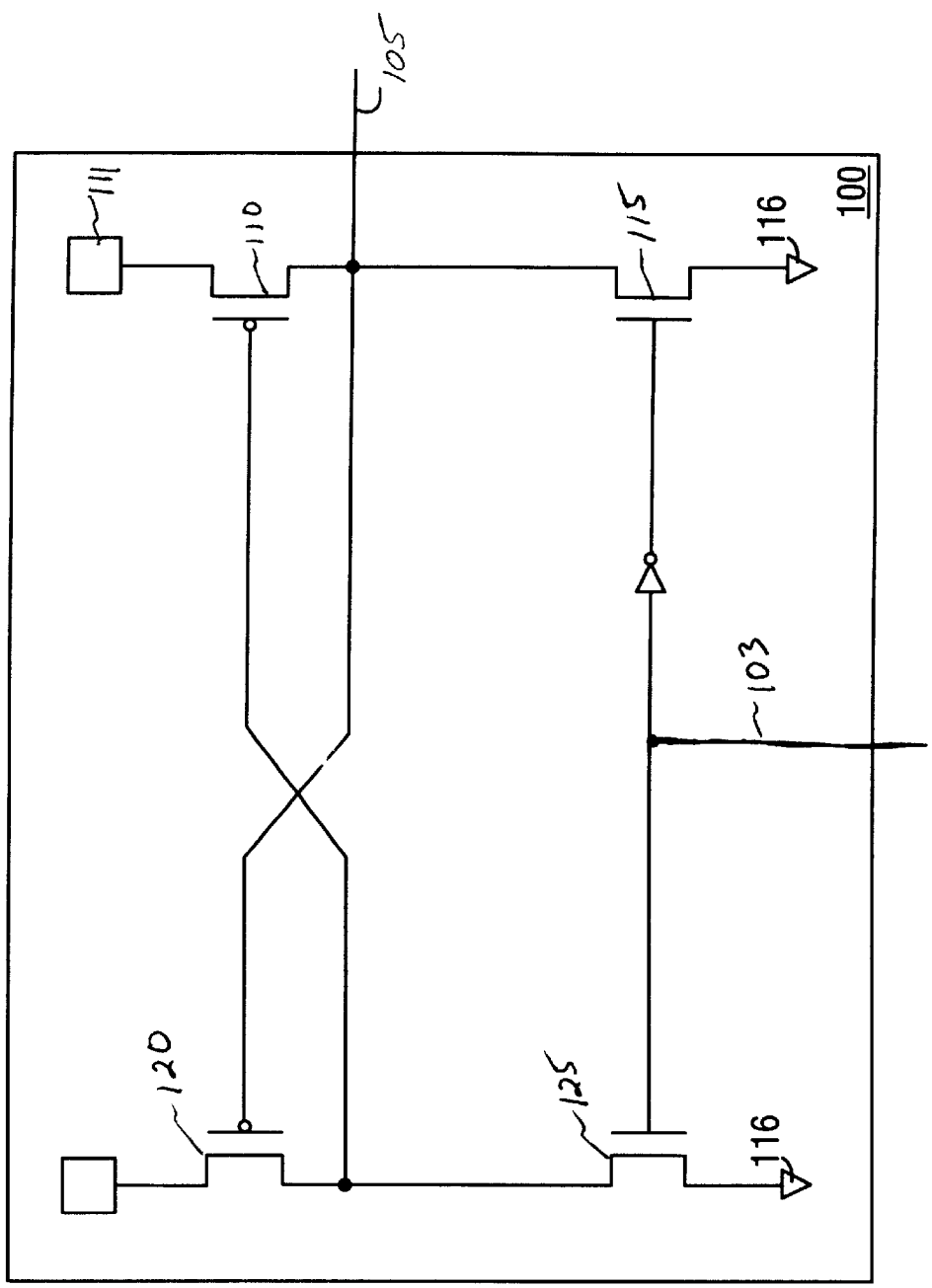
FIG. 1 is a circuit diagram for a first stage of a prior output buffer.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in an output buffer used in a mixed voltage environment. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

Figure 2:
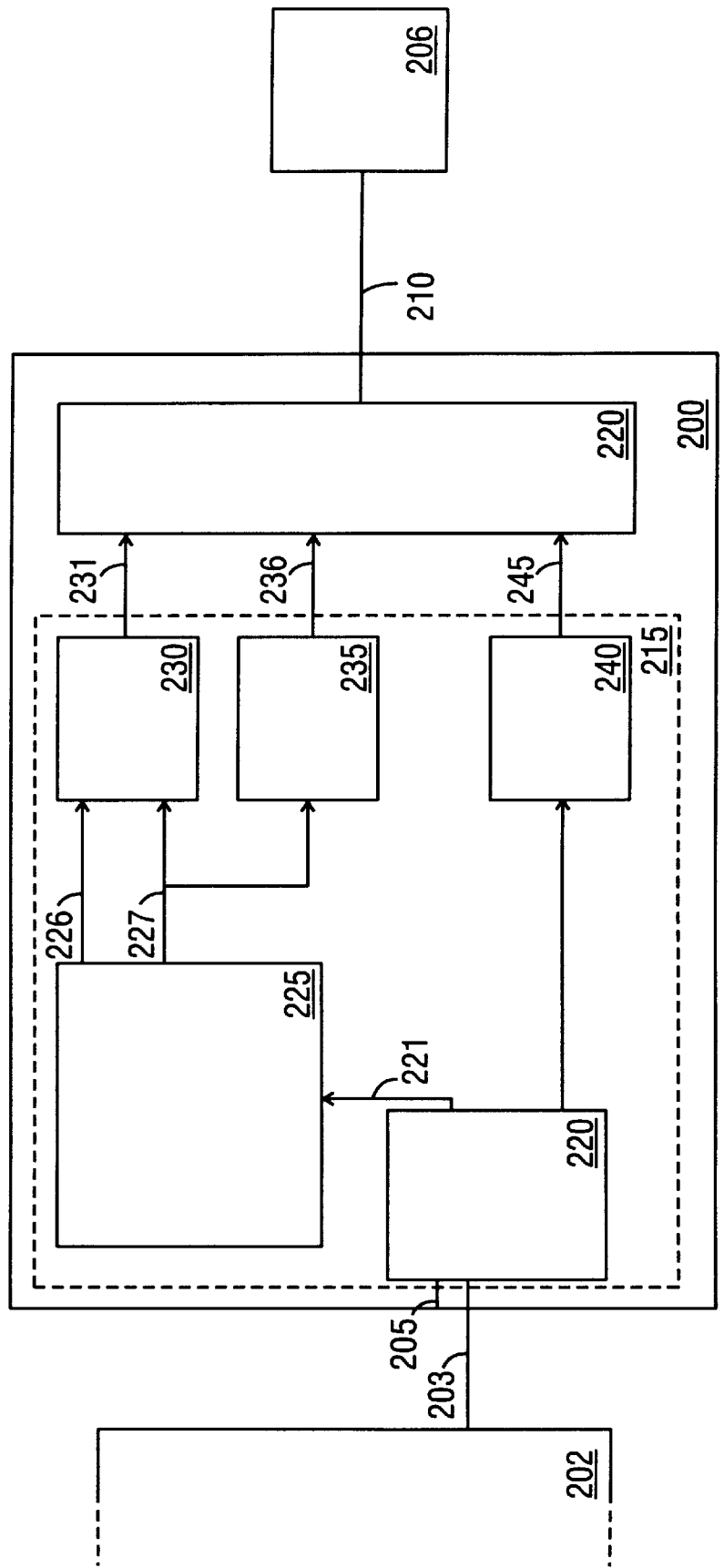
FIG. 2 is a schematic and block diagram of a system in which an output buffer according to the present invention may be implemented.

FIG. 2 is a simplified block diagram for a system in which an output buffer 200 in accordance with the invention, is connected to a microprocessor "core" 202 by a line 203 and is connected to a peripheral component 206 by a line 210. One skilled in the art will note that the output buffer 200 includes a first stage (i.e., a predriver circuit) 215 and a second stage (i.e., a driver circuit) 220, which applies the signal to the line 210 so it may be sent to a peripheral device 206. As previously mentioned, signals are transmitted between the processor core and the peripheral device 206 by the output buffer 200. The first stage 215 is shown in more detail in FIG. 6.

Within the first stage 215 of the output buffer 200, an input selection circuit 220 receives signals on the lines 203, 205. The signal on the line 203 may be data that the microprocessor core 202 is sending to a peripheral device while the signal on the line 205 may be an output enable signal also delivered from the microprocessor core 202. The selection circuit 220 generates an output signal that is sent to a level shifting circuit 225. The level shifting circuit 225 is designed to receive the signal on a line 221. The signal on the line 221 was generated by the microprocessor core 202, and thus has a voltage between the voltage $V_{ss}$ and the voltage $V_{cc}$. In response to receiving a signal on the line 221, the level shifting circuit 225 generates a first signal on the line 226 with a voltage between the voltage $V_{ccp}$ and the voltage $V_{refL}$. A second signal is applied to the line 227 with a voltage between the voltage $V_{ss}$ and the voltage $V_{refH}$.

The signals generated by the level shifting circuit 225 are sent to a circuit 230, which may be used to drive the driver circuit 220. The circuit 230 is designed to apply a signal to a line 231 that controls the maximum rate that current is changing. A transition pull down circuit 235 also receives the signal applied to the line 227, and generates a signal on a line 236 that may be used to compensate for an impedance increase when the output buffer 200 is generating a logically high signal on the line 210. Similarly, a pull up circuit 240 generates a signal on a line 245 that may be used to compensate for increased impedance when the output buffer 200 is applying a logically low signal to the line 210.

The general purpose of the invention is the creation of an output buffer 200 that will function properly in a mixed voltage environment without subjecting transistors to gate stress for an extended period of time. The output buffer predriver 215 introduced by this invention uses an NMOS level shifting circuit with gate stress protection. The output buffer 200 is fully functional, complies with timing requirements under extreme operating conditions and wide process variations, and supplies the desired protection against gate stress. Use of the output buffer 200 manipulates and conditions the signal applied to the line 203 in such a manner that it may be used effectively by the peripheral device 206.

Specific Embodiments

Figure 7:
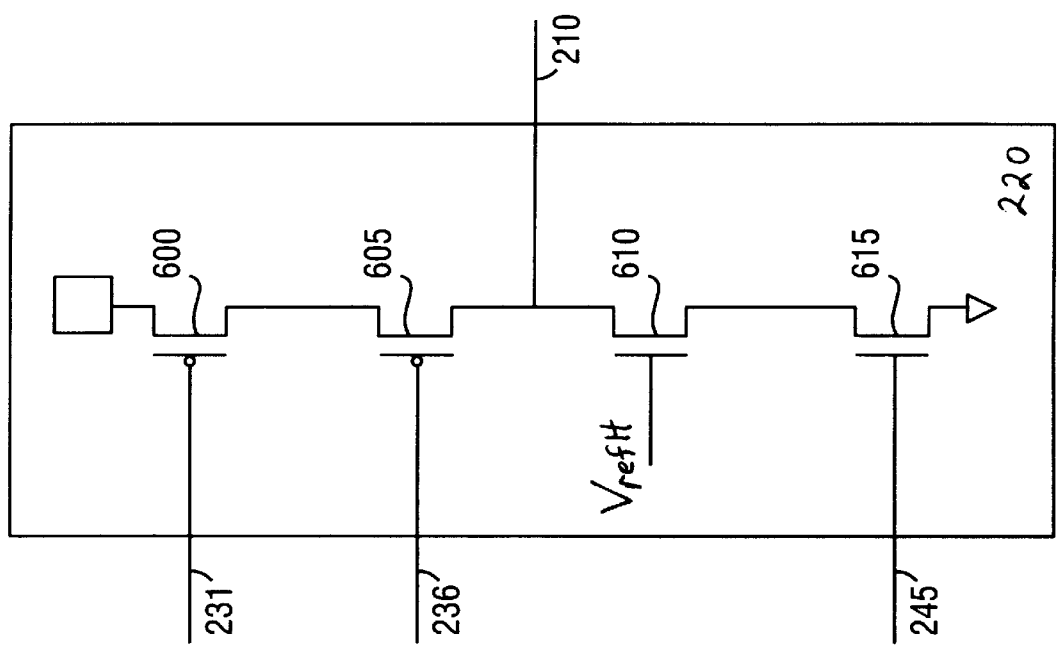
FIG. 7 is circuit diagram for a driver circuit that may be used in an output buffer in accordance with the invention.

FIG. 7 is a circuit diagram for one embodiment of a driver circuit 220 that may be used in the output buffer 200 according to the present invention. Transistors 605, 610, which are driven by the voltage $V_{refL}$ and the voltage $V_{refH}$, respectively, are used to limit the voltage and protect these transistors from gate stress. A transistor 600 has a gate terminal coupled to the line 231. One skilled in the art will appreciate that when at least one of the transistors 600, 615 are enabled, a signal may be applied to the line 210 and sent to the peripheral device 206. Additionally, other types of driver circuits may be used without departing from the inventive concepts previously described.

Figure 3:
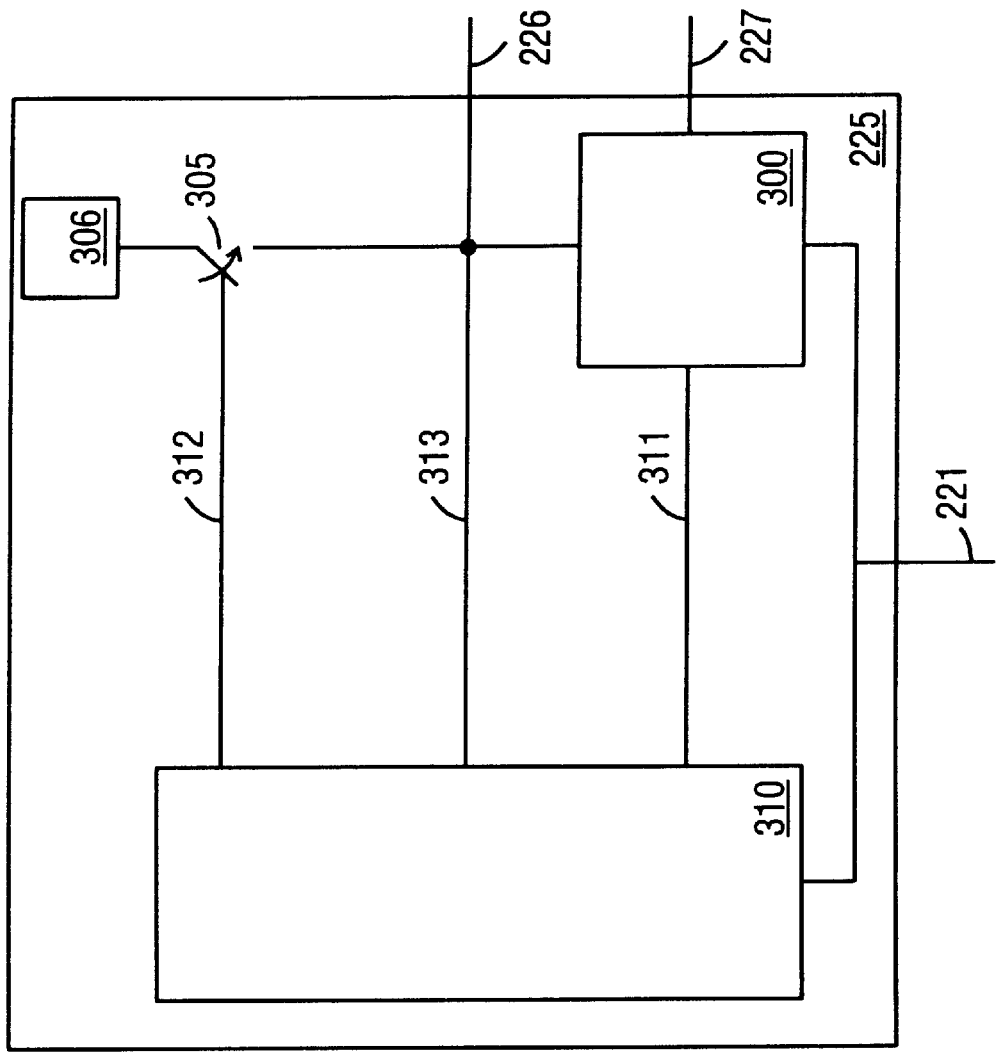
FIG. 3 is a general schematic diagram for a portion of a predriver circuit of an output buffer according to the present invention.

FIG. 3 is a block diagram for the level shifting circuit 225. When a signal is applied to the line 221 by the core circuit 202, it may be sent to a pull-down network 300, which may be used to apply a logically low signal to the line 226 when enabled. A switch 305 is connected to a voltage supply 306, which generates a level-shifted logically high voltage $V_{cpp}$. When closed, the switch 305 may be used to apply a logically high signal to the line 226. A logic circuit 310 is connected both to the pull-down logic network 300 and the switch 305 by the lines 311, 312. The logic circuit 310 may be used to alternatively enable the switch 305 and the pull-down logic network 300, allowing signals to be applied to the line 226. The logic circuit 310 is also connected to the line 226 by the line 313, which may be used to sense the voltage level on the line 226.

Figure 4:
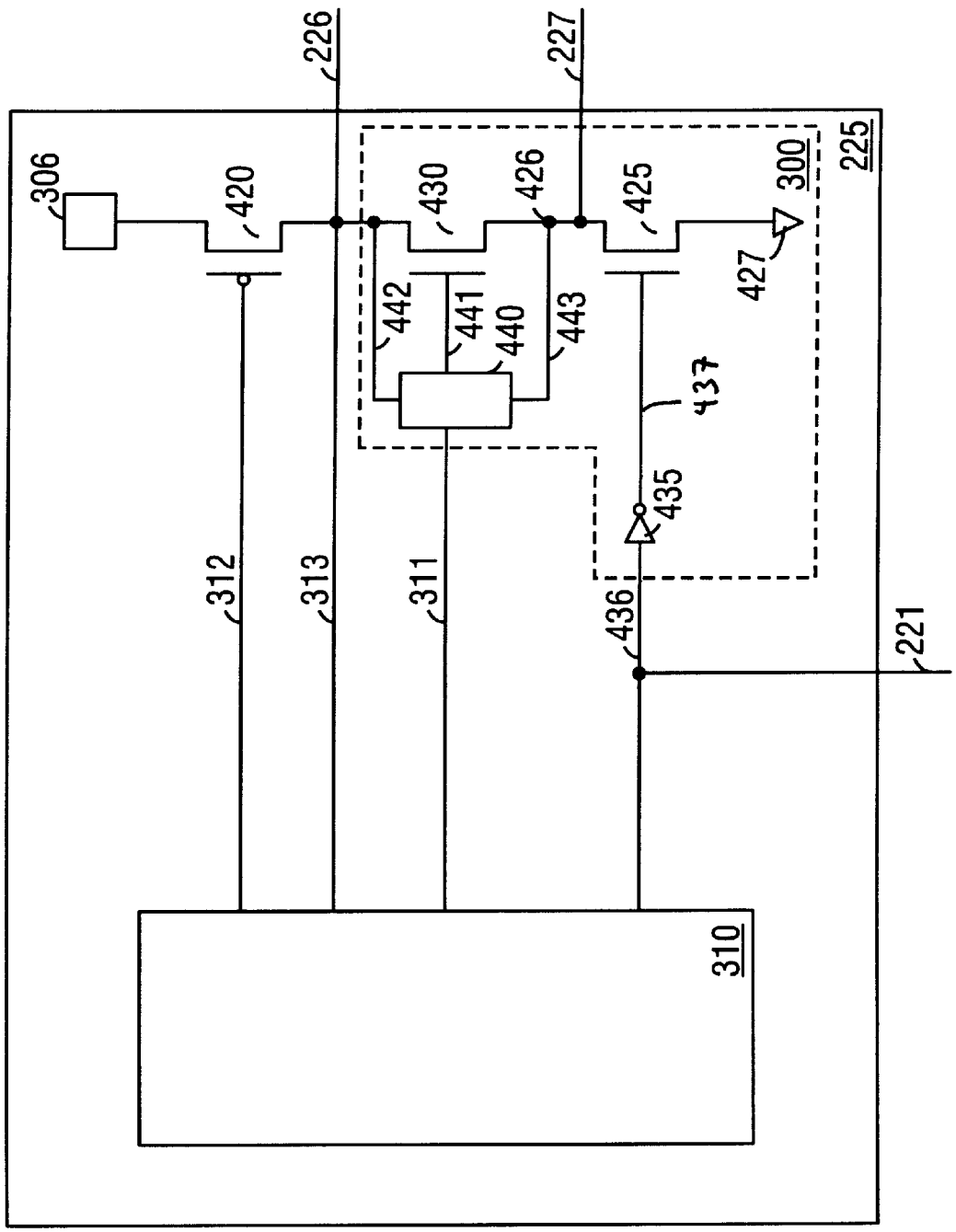
FIG. 4 is a partial circuit diagram for the predriver circuit of FIG. 3.

FIG. 4 is a more detailed block diagram of one embodiment of the level shifting circuit 225 of this invention. The switch 305 has been replaced by a PMOS transistor 420 that has a gate terminal connected to the line 312. One skilled in the art will appreciate that though the transistor 420 is a MOS (metal oxide semiconductor) transistor, it may be replaced by any transistor topology (e.g., bipolar transistors and field effect transistors) that allows for complementary transistors. When a logically low signal is applied to the line 312, the transistor 420 is enabled, and a logically high signal is applied to the line 226.

The pull-down logic network 300 includes two NMOS transistors 425, 430, an inverter 435, and a control circuit 440. The transistor 425 is coupled between a node 426 and the ground voltage supply $V_{ss}$ 427. The inverter 435 has an input terminal 436 coupled to the line 221 and an output terminal 437 coupled to the gate terminal of the transistor 425. The logic state of the signal that is applied to the line 221 is inverted and then applied to the gate terminal of the transistor 425. When the signal on the line 221 is a logically low signal, the transistor 425 is enabled, allowing a logically low signal to be applied to the line 226 if the transistor 430 is enabled.

The control circuit 440 has a terminal 441 connected to a gate terminal of the transistor 430, which allows it to enable the transistor 430 in response to signals received on its terminal 311 by applying a signal having a reference voltage level $V_{refH}$. One skilled in the art will appreciate that the control circuit 440 is designed to sense a voltage level in the logic circuit 310. This sensing mechanism reduces gate stress by enabling the transistor 430 when the transistor 425 is biased on.

Figure 5:
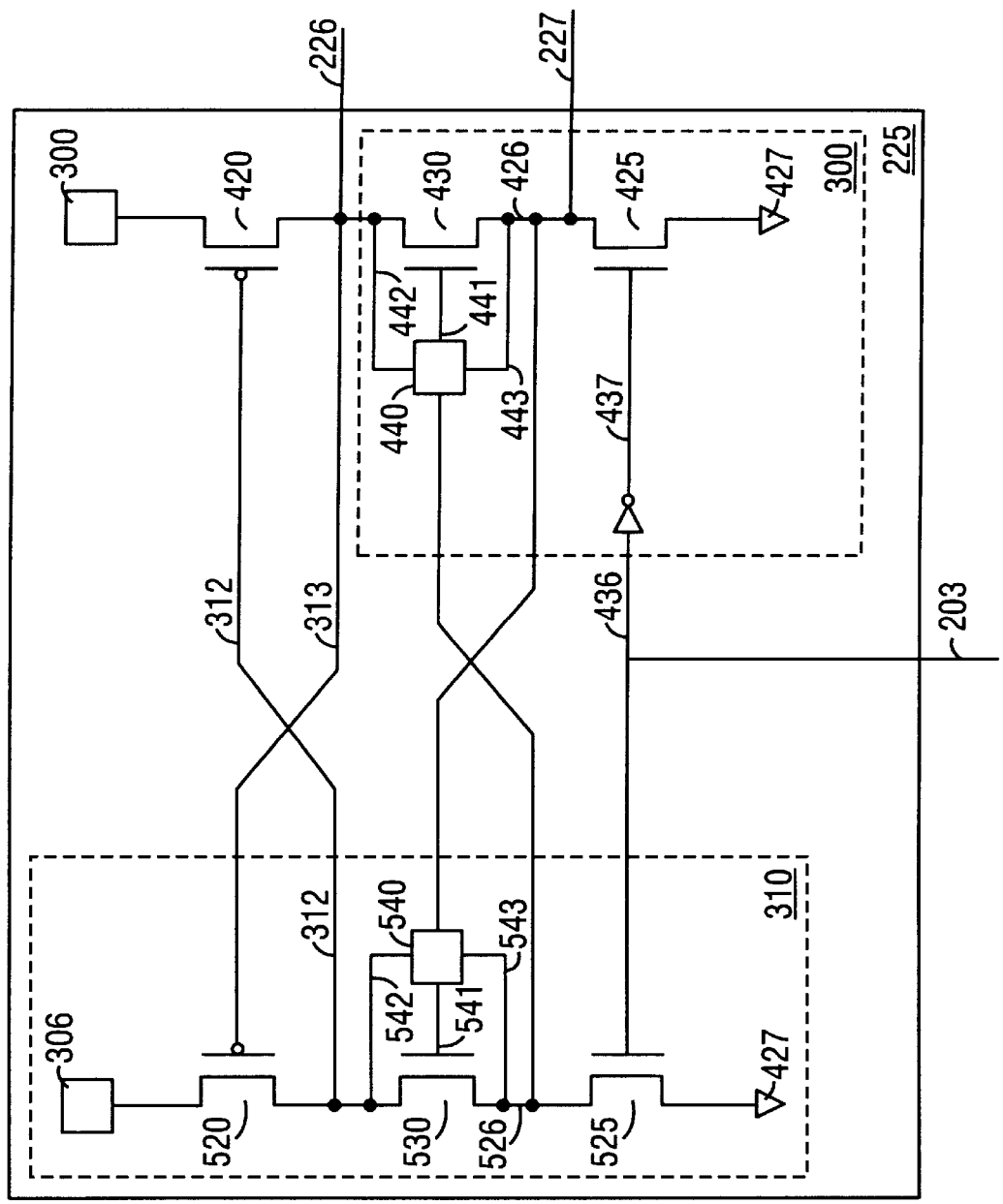
FIG. 5 is a detailed circuit diagram for the predriver circuit of FIG. 4.

FIG. 5 is more detailed block diagram for one embodiment of the level shifting circuit 225 of the output buffer 200 in accordance with the invention. One skilled in the art will recognize the symmetry of this stage of the output buffer 200. The logic circuit 310 includes transistors 520, 525, 530 and a control circuit 540. The logic circuit 310 may be designed such that it enables or disables the transistor 420. If a logically high signal is applied to the line 312, the PMOS transistor 420 is disabled, which allows the line 226 to be driven to a logically low level by enabling the transistor 425.

When driving the line 226 to a logically low voltage, a voltage $V_{cc}$ is applied to the line 437, enabling the transistor 425 and disabling the transistor 525. At this point, the control circuit 440 is driving the line 441 to the logically high reference voltage $V_{refH}$. This allows the line 226 to be pulled down strongly toward the voltage level $V_{ss}$, The lowering of the voltage level on the node 526 is sensed by the control circuit 440, which responds by changing the driving level of the line 441 to the voltage $V_{ss}$ which disables the transistor 430 and avoids pulling the line 226 down any further. Rather, the line 226 is driven to the voltage $V_{refL}$ by the control circuit 440 over the line 442.

The lowering of the voltage on the line 226 enables the transistor 520, which then applies a voltage approximately equal to the voltage $V_{ccp}$ to the line 312. The presence of this logically high voltage on the line 312 disables the transistor 420. The logically high voltage $V_{ccp}$ on the line 312 also propagates through the transistor 530 to the node 526 such that the voltage on the node 526 is approximately equal to the voltage $V_{refH}-V_{tn}$. The logically low state on the node 426 is sensed by the control circuit 540, which then drives the line 541 to the voltage $V_{refH}$ Assume that a steady state condition exists in which the line 226 is in a logically high state. Thereafter, the line 203 is pulled to a logically low level by the microprocessor core 202, biasing the transistor 525 off and the transistor 425 on. With the transistor 425 biased on, the line 226 is pulled toward $V_{ss}$, which biases the transistor 520 on. The transistor 520 passes $V_{ccp}$ to the gate of the transistor 420. Since the line 226 is at about $V_{ss}$, then the transistor 420 is potentially subject to gate stress. The period of time that the transistor 420 is potentially subjected to gate stress is minimized by the operation of the control circuits 440, 540. That is, the transistor 425 has also pulled the line 227 to $V_{ss}$ which causes the control circuit 540 to drive the line 541 to $V_{refH}$, which biases the transistor 530 on, charging the node 526 to $V_{refH}-V_{tn}$. This voltage on the node 526 is detected by the control circuit 440, which drives $V_{ss}$ on the gate of the transistor 430, biasing it off, and $V_{refL}$ onto the line 226. Thus the voltage drop across the transistor 420 is reduced to $V_{ccp}-V_{refL}$, eliminating gate stress.

Figure 6:
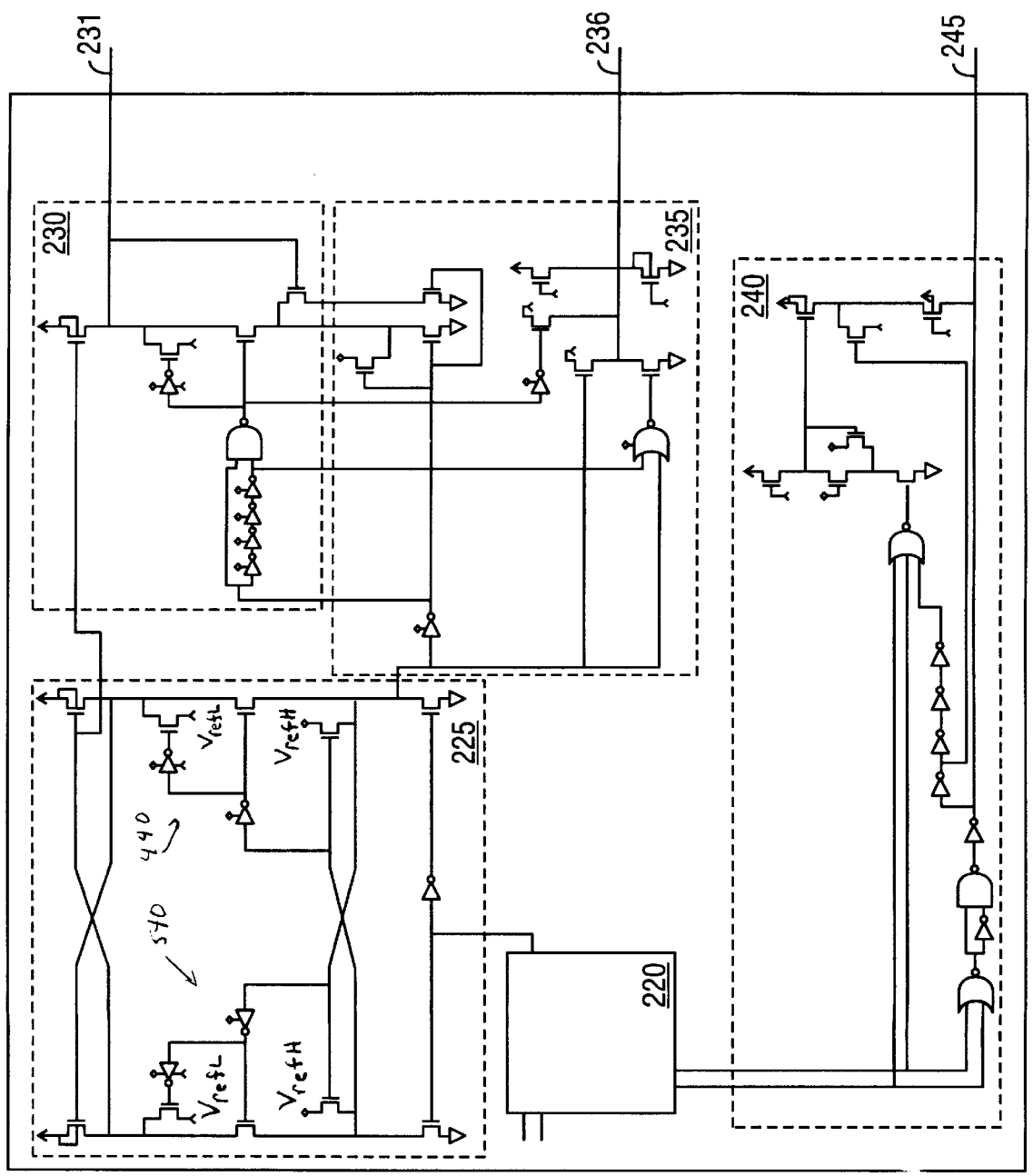
FIG. 6 is a detailed circuit diagram for an embodiment of the predriver of FIG. 5.

FIG. 6 is a detailed schematic for an embodiment of the buffer 200. In particular, FIG. 6 illustrates one embodiment of the control circuits 440,540. The control circuits 440,540 include a pair of inverters and transistors coupled to the voltage sources $V_{refH}$ and $V_{refL}$.

The invented output buffer 200 uses NMOS pull down transistors, which impact the circuit topology. Unlike the prior art output buffer, the present invention removes DC current paths, eliminating power consumption at steady state. The invented output buffer 200 provides up to 40 percent improvement in the delay performance, as compared to the prior art output buffer, and is less sensitive to process variations. The first stage of the invented output buffer occupies one-third less area in comparison to conventional devices.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. A buffer, comprising:
   a first transistor coupled between a voltage supply and an output terminal;
   a second transistor having one terminal coupled to a voltage supply return;
   a third transistor coupled in series between said first and second transistors; and
   a first logic circuit coupled across said third transistor and also to its gate terminal to control a level-shifted output voltage onto the output line while reducing gate stress on at least one of said transistors.

2. The buffer of claim 1 wherein said first logic circuit receives a sense signal for controlling an operation of said third transistor.

3. The buffer of claim 2 wherein an input signal for driving said second transistor has its signal voltage level isolated from the output voltage levels when generating the level-shifted output voltage.

4. The buffer of claim 3 further comprising a second logic control circuit to generate the sense signal to said first logic circuit said first logic circuit controlling the activation of said third transistor in response to the sense signal.

5. The buffer of claim 4 wherein said second logic circuit is cross-coupled with the first logic circuit.

6. The buffer of claim 5 wherein said second logic circuit is configured to provide an equivalent operation as said first, second and third transistors on fourth, fifth and sixth transistors to generate the sense signal.

7. The buffer of claim 6 wherein said first logic circuit further includes an inverter having its input terminal coupled to receive the sense signal and its output terminal coupled to the gate of said third transistor.

8. The buffer of claim 7 wherein said first, second, third, fourth, fifth, and sixth transistors are comprised of FET transistors or bipolar transistors.

9. A buffer comprising:
   a first transistor coupled between a voltage supply and an output terminal;

a second transistor having one terminal coupled to a voltage supply return;

a third transistor coupled between the output terminal and a second terminal of said second transistor;

a first control circuit coupled to the output terminal, the second terminal of said second transistor and an enable terminal of said third transistor to control a level-shifted output voltage onto the output line, while reducing gate stress on at least one of said transistors; and a second control circuit cross-coupled to provide a sense voltage to enable said first transistor, said second transistor and said first control circuit.

10. The buffer of claim 9 wherein said second control circuit further comprises fourth, fifth, and sixth transistors, said fourth transistor being coupled between said voltage supply and an enable terminal of said first transistor, said fifth transistor being coupled to said first control circuit.

11. The buffer of claim 10 wherein said sixth transistor is coupled in series with said fifth transistor, said sixth transistor being coupled to said first control circuit.

12. The buffer of claim 11 wherein said second control circuit enables said sixth transistor.

13. The buffer of claim 12, further comprising seventh, eighth, ninth, and tenth serially configured transistors coupled to operate as a driver for the level-shifted output voltage, said output terminal coupled to drive a gate of one of the seventh eighth, ninth or tenth transistor.

14. The buffer of claim 13 wherein first, second, third, fourth, fifth, sixth, seventh, eighth, ninth, and tenth transistors are comprised of MOS transistors, FET transistors, or bipolar transistors.

15. An output buffer, comprising:

a first PMOS transistor coupled to a voltage supply and an output terminal;

a first NMOS transistor coupled to a voltage supply return;

a second NMOS transistor coupled between said output terminal and a drain terminal of said first NMOS transistor;

a first control circuit to enable said second NMOS transistor, said first control circuit being coupled to said output terminal, a gate terminal of said second NMOS transistor, and said drain terminal of said first NMOS transistor;

a second PMOS transistor coupled to said reference voltage supply and a gate terminal of said first PMOS transistor, said second PMOS transistor having a gate terminal coupled to said output terminal;

a third NMOS transistor coupled to said voltage supply return and to said first control circuit;

a fourth NMOS transistor coupled to said third NMOS transistor and to said gate terminal of said first PMOS transistor; and a second control circuit to enable said fourth NMOS transistor, said second control circuit coupled to said gate terminal of said first PMOS transistor, said first control circuit and to said drain terminal of said first NMOS transistor.

16. The buffer of claim 15 wherein said first and second control circuits includes MOS transistors.

17. The buffer of claim 15, further comprising first, second, third, and fourth serially configured transistors coupled to operate as a driver for the level-shifting output voltage, said output terminal coupled to drive a gate of one of the serially configured transistors.

18. The buffer of claim 17, in which a buffer output terminal from the driver is coupled to a peripheral device.

19. A computer system having an interface circuit to buffer an output signal comprising:

a first transistor coupled between a voltage supply and an output terminal;

a second transistor having one terminal coupled to a voltage supply return;

a third transistor coupled in series between said first and second transistors; and a first control circuit coupled across said third transistor and also to its gate terminal to control a level-shifted output voltage onto the output line, while reducing gate stress on at least one of said transistors.

20. The computer system of claim 19 wherein said first control circuit receives a sense signal for controlling an operation of said third transistor.

21. The computer system of claim 20 wherein an input signal for driving said second transistor has its signal voltage level isolated from the output voltage levels when generating the level-shifted output voltage.

22. The computer system of claim 21 further comprising a second control circuit to generate the sense signal to said first control circuit, said first control circuit controlling the activation of said third transistor in response to the sense signal.

23. The computer system of claim 22 wherein said second control circuit is cross-coupled with the first control circuit.

24. A method of buffering signals comprising:

providing a serially configured set of transistors coupled between a supply voltage and its return, in which one transistor is utilized to pull an output line up toward the supply voltage, a second transistor is utilized to pull the output line down toward the supply return and a third transistor is placed between the pull-up and pull-down transistors;

coupling a control circuit to the third transistor to control the activation of the third transistor;

inputting an input signal to an enable terminal of the pull-down transistor;

controlling the third transistor by use of the control circuit to output a level-shifted voltage output in response to the input signal, the control circuit operating to reduce gate stress to at least one of the transistors.

* * * * *